United States Patent [19]

Itoh

[11] Patent Number: 5,557,110

[45] Date of Patent: Sep. 17, 1996

[54] APERTURE FOR USE IN ELECTRON BEAM SYSTEM FOR PATTERN WRITING

[75] Inventor: Katsuyuki Itoh, Tokyo, Japan

[73] Assignee: NEC Corporation, France

[21] Appl. No.: 375,487

[22] Filed: Jan. 19, 1995

[51] Int. Cl.$^6$ ................................................ H01J 37/09
[52] U.S. Cl. ........................... 250/492.23; 250/505.1; 430/5
[58] Field of Search ..................... 250/492.23, 505.1; 430/5

[56] References Cited

U.S. PATENT DOCUMENTS

| | | | |
|---|---|---|---|
| 4,950,568 | 8/1990 | Kraus | 250/505.1 |
| 5,256,881 | 10/1993 | Yamazaki et al. | 250/492.23 |

FOREIGN PATENT DOCUMENTS

| | | |
|---|---|---|
| 54-29981 | 3/1979 | Japan . |
| 61-183926 | 8/1986 | Japan . |
| 3-64016 | 3/1991 | Japan . |

*Primary Examiner*—Jack I. Berman
*Attorney, Agent, or Firm*—Hayes, Soloway, Hennessey, Grossman & Hage, P.C.

[57] ABSTRACT

Window-like openings are cut through an aperture with cell projecting blocks using an electron beam system with pattern writing capability, and isolated patterns are supported by microbridges in respective openings. Widths of the microbridges are less than the resolution limitation of the electron beam, and thereby isolated patterns, such as frame-shaped shading patterns, can be written of a resist film, and the through-put of the lithography process can be increased. The aperture with cell projecting blocks can be formed so as to utilize both positive and negative resist film masks.

6 Claims, 9 Drawing Sheets

APERTURE FOR USE IN ELECTRON BEAM SYSTEM FOR PATTERN WRITING

BACKGROUND OF THE INVENTION

1. Field of the Invention

The invention relates to an aperture for an electron beam system for pattern writing, and especially to an aperture with cell projecting blocks of an electron beam system with pattern writing capability used in a manufacturing process of a large scale integrated circuit.

2. Brief Description of the Related Art

Because of recent the tendency towards microfabrications and high density integrations in large scale integrated circuits, electron beam lithography, being capable of minute processing, has come to be widely used. In an electron beam system designed for this purpose, an electron beam, being irradiated from an electron source, passes through an aperture, and is shaped into a narrow beam and projected (written) on an electron-beam-sensitive film (resist film) on a semiconductor substrate. The aperture is provided with various kinds of patterns, and the cross-section of the transmitted electron beam through the aperture has a shape suitable for pattern writing. In most cases, patterns to be written on the resist film are repetitive in nature, and the following is regarded as most promising one of increasing the through-put of the electron beam lithography and the flexibility of system operation. That is to say, the cell pattern is cut through the mask as one block, and written on the resist film by the electron beam irradiation at one time. The pattern writing process is continued by scanning the electron beam over the resist film on the substrate.

With regard to the aperture with cell projecting blocks, however, the following disadvantages have been discovered. In constructing a cell projecting block, it becomes sometimes necessary to support plural isolated patterns in a window-like opening, without undesirable shadows of supporting members projected on the resist film. Various methods have been proposed to accomplish this however, heretofore an acceptable method for accomplishing same has not yet been established. Moreover, there are two (positive and negative) types of resist films. Thus, it would be described for the electron beam system to be able to be used with both types of resist films, however, an the electron beam system with such capability has not yet been developed. It should be noted that the aperture is consisted of many aperture portions with cell projecting blocks, and will be discussed in connection with the construction and function of each aperture portion.

SUMMARY OF THE INVENTION

Accordingly, it is an object of the invention to provide an aperture with a cell projecting block for use in an electron beam system with pattern writing capability having a high throughput, in which plural isolated patterns can be supported securely and the shadows of supporting members are never projected on a resist film.

According to one feature of the invention, an aperture with a cell projecting block for use in an electron beam system with pattern writing capability comprises:

at least one window-like opening cut through a plate-shaped mask and a plurality of isolated patterns supported by microbridges with widths, smaller than a limitation of resolution of the electron beam.

BRIEF DESCRIPTION OF THE DRAWINGS

The invention will be explained in more detail in conjunction with appended drawings, wherein.

DESCRIPTION OF THE PREFERRED EMBODIMENTS

Before explaining the preferred embodiments of the aperture with cell projecting blocks for use in an electron beam system with pattern writing capability according to the invention, the aforementioned conventional apertures with cell projecting blocks will be explained referring to FIGS. 1 to 4.

Figure 1:
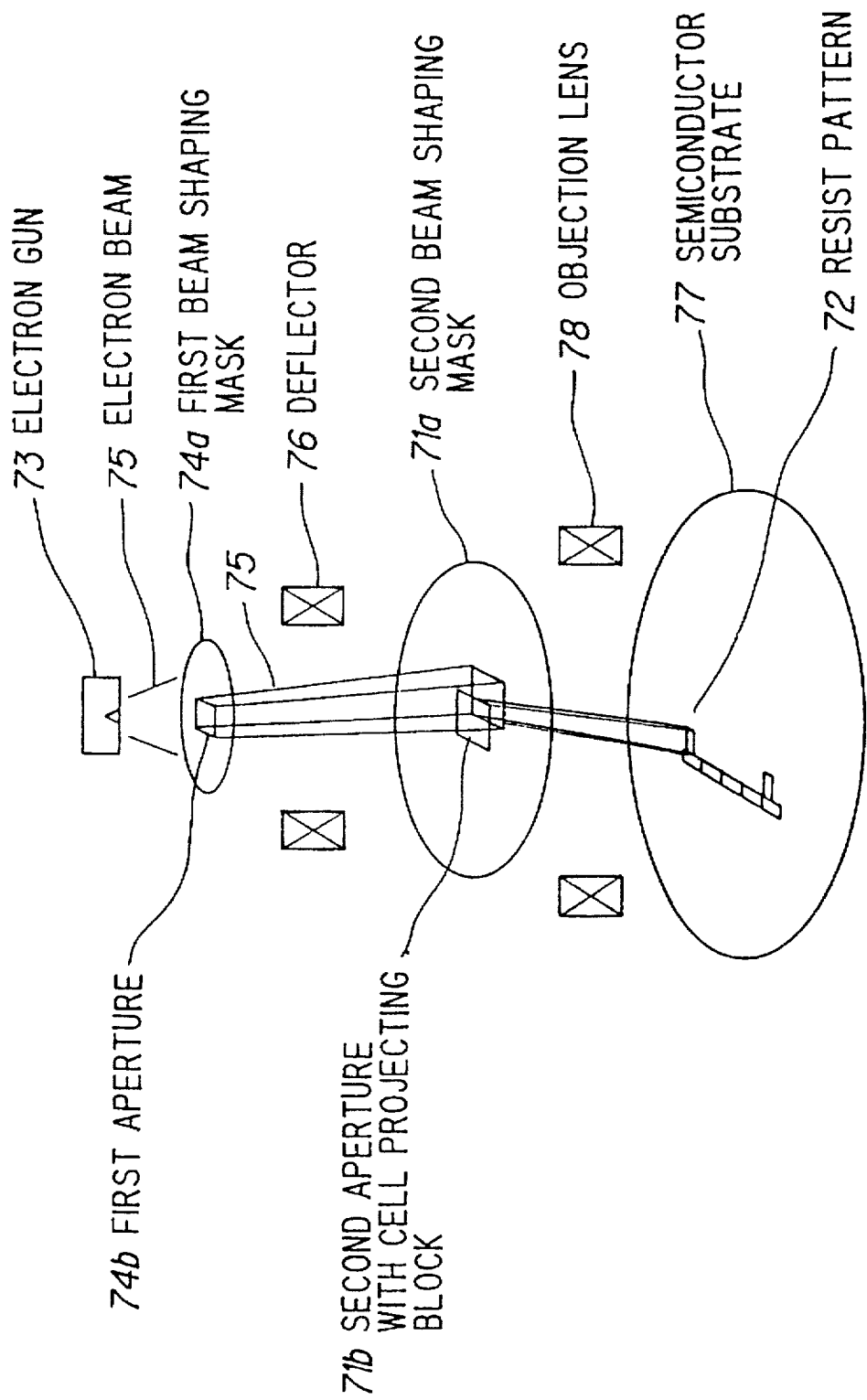
FIG. 1 is a diagram of the structure of a conventional electron beam system with an aperture with cell projecting blocks.
Figure 2:
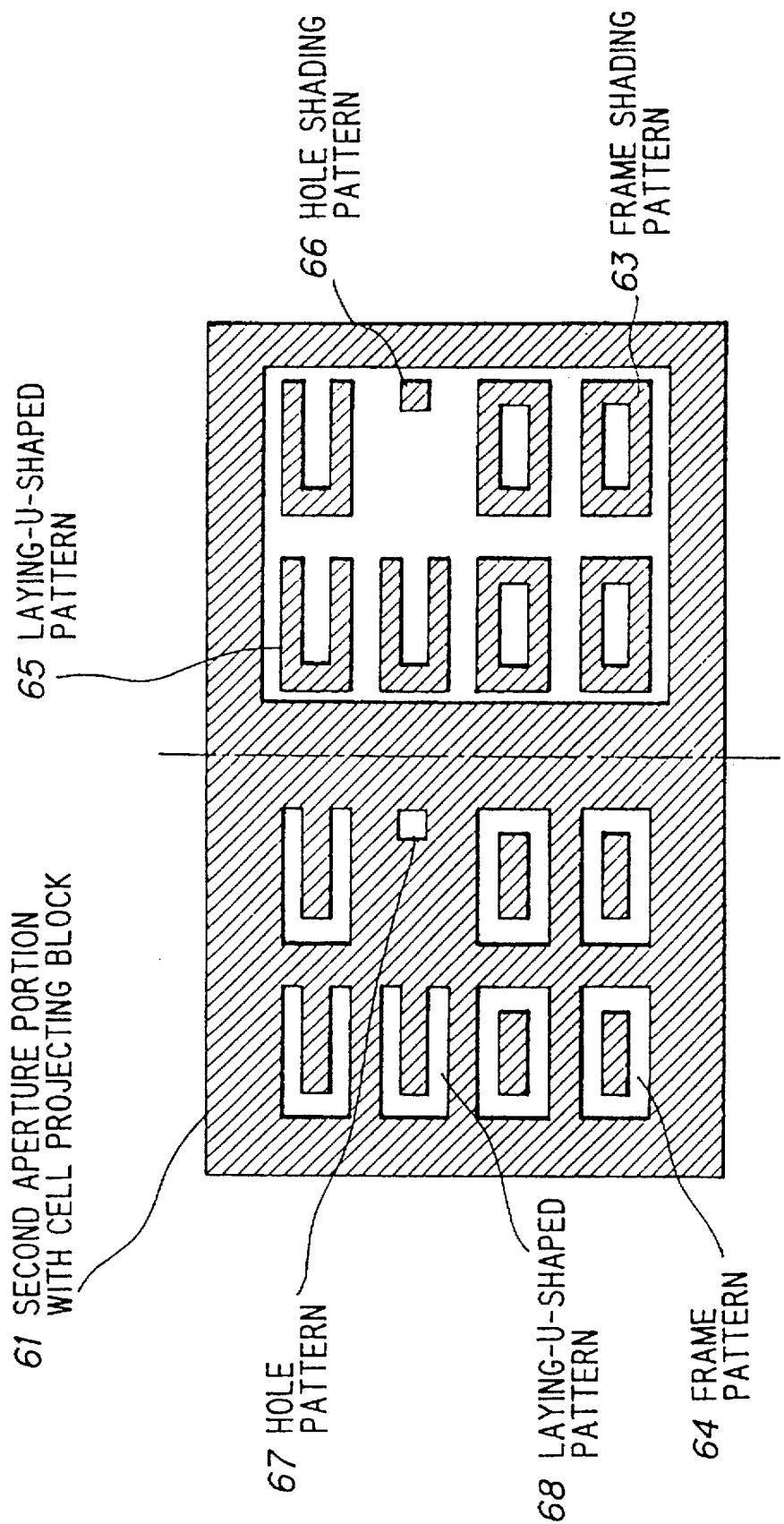
FIG. 2 shows an aperture portion with a cell projecting block in a conventional electron beam system.
Figure 3:
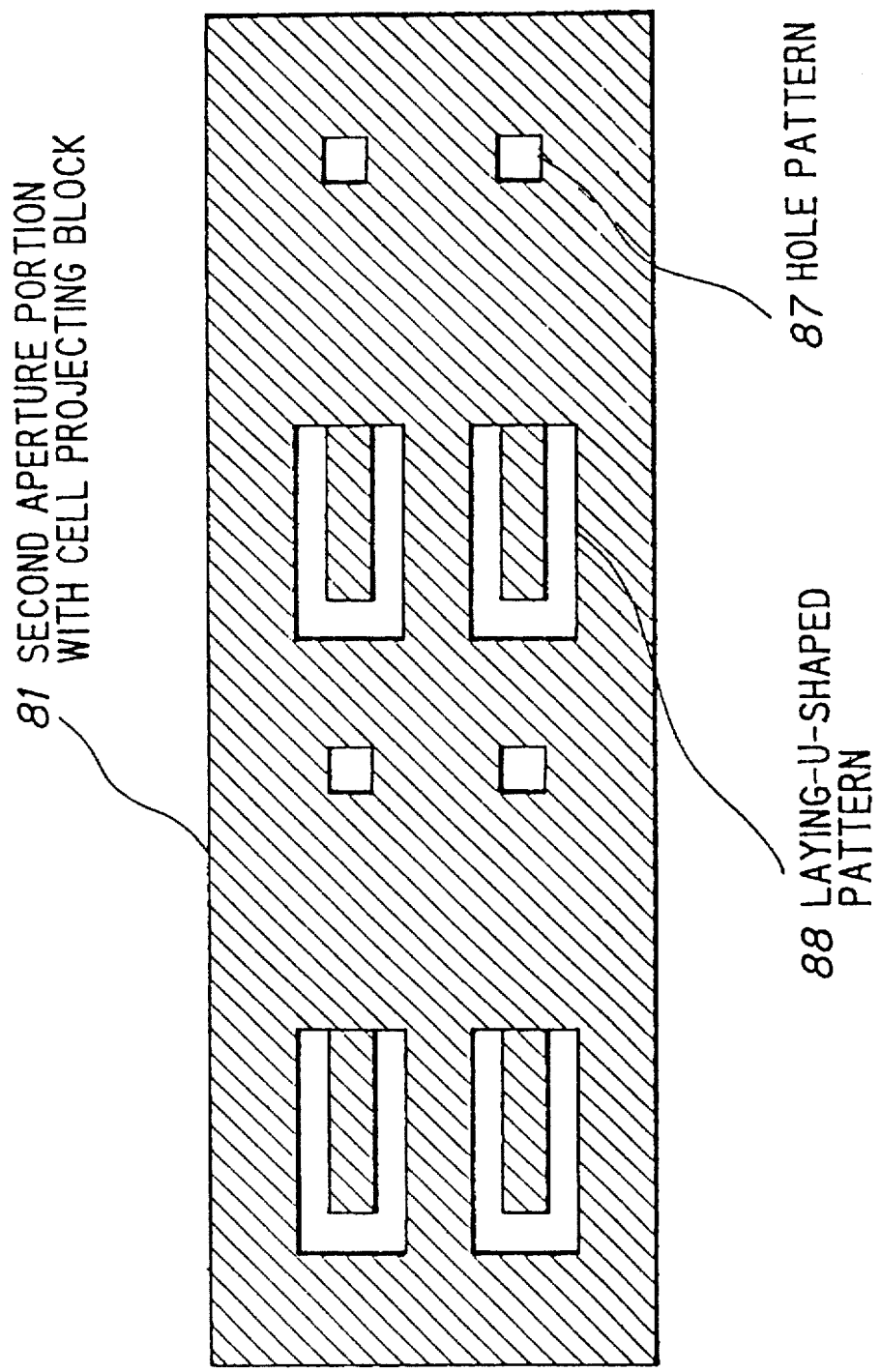
FIG. 3 shows an enlarged view of a portion of an aperture with a cell projecting block for use in a conventional electron beam system.

A diagram of the construction of one conventional electron beam system designed for this purpose is shown in FIG. 1. An electron beam irradiated from an electron gun 73 is projected on a first rectangular aperture 74b, which is cut in a beam shaping mask 74a. The cross-sectional area of the incident electron beam 75 near the aperture 74b is slightly larger than the area of the latter, and beam 75 also has a rectangular cross-section. Moreover, a second rectangular aperture 71b is cut through a second beam shaping mask 71a. The cross-sectional area of the transmitted electron beam 75 at the second rectangular aperture 71b can be adjusted at will by controlling overlapping of the apertures 74b and 71b. Electron beam with a small cross-sectional area can thus be obtained and is projected on a semiconductor substrate 77, one surface of which is covered with an resist film pattern 72 at a predetermined position and with prescribed dimensions. Device 76 serves as a beam deflector.

However, the following disadvantage has been discovered in the aforementioned electron beam system. A very long time is necessary, to write a desired pattern because the electron beam must trace the desired pattern almost continually on account of the small spot size of the incident electron beam, and thus, through-put using this technique is very low.

An electron beam system for pattern writing, capable of improving the through-put, is disclosed in Japanese Patent Kokai No. 54-29981. In this system, one prescribed cell pattern block with a repetitive pattern is cut through the second aperture 71b, and is entirely projected and written on the resist film on the semiconductor substrate 77 by electron beam irradiation at one time, and thus a remarkable improvement in the through-put can be achieved.

In such an electron beam system as described in the above, the aperture with the cell projecting blocks on the second aperture 71b plays the most important role in improving the through-put. In accordance with a great variety of requirements, an electron beam system for the cell projecting blocks must be provided with apertures having various kinds of patterns including isolated patterns shown in FIG. 2, such as a frame shading pattern 63, a frame pattern 64, a laying-U-shaped pattern 68 and a hole shading pattern 66. However, the above mentioned isolated patterns cannot be realized without specialized techniques. One proposal for solving this problem is disclosed in Japanese Patent Kokai No. 3-64016, in which semiconductor surfaces having the configuration shown in FIGS. 7 and 8 can be obtained by combining two projections using an aperture portion shown in FIG. 3. In the above mentioned method, several projections must be combined to obtain desired patterns in most cases, and there is a limit to improving the through-put using this technique.

Another method to improve through-put is disclosed in Japanese Patent Kokai No. 61-183926. In this method, an isolated pattern is supported by a net with fine meshes which cannot be resolved by an electron beam. However, it is extremely difficult to uniformly expand the net over an opening in the second aperture, and it becomes impossible to do so when the area of the net is large. An aperture, free of these difficulties is disclosed in Japanese Patent Kokai No. 3-64016. In this aperture, a rectangular shading pattern 91 is suspended by suspending wires 92, which cannot be resolved by the electron beam, as shown in FIG. 4.

Figure 4:
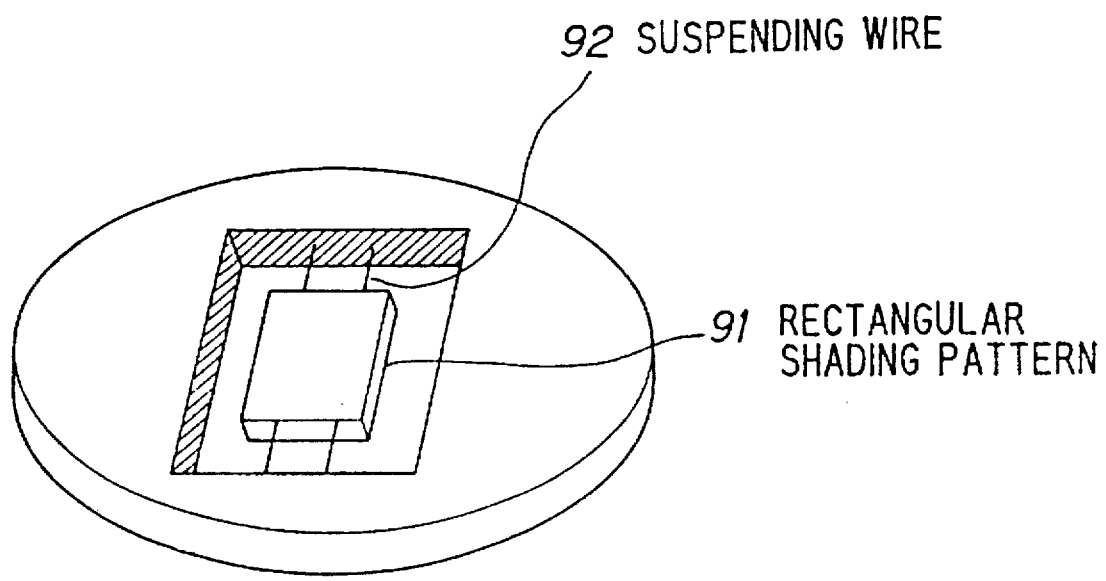
FIG. 4 shows a portion of a aperture with a cell projecting block in another conventional electron beam system.

In a conventional aperture portion, of the tape shown in FIG. 4, for use in an electron beam system with cell projecting blocks, only a single pattern is supported. In other words, plural patterns cannot be supported. Accordingly, when projections of various kinds of patterns are required, each kind of pattern must be individually projected on the resist film on the surface of the semiconductor substrate, and therefore through-put in this lithography process is greatly reduced. Moreover, there are two types of resist films (i.e. positive and negative). Some conventional apertures with cell projecting blocks can only be used with one type of resist film, (i.e. positive or negative). Thus, such conventional apertures with cell projecting blocks sometimes cannot be used because of incompatibility with the type of the resist film being used.

It is an object of the invention to advance pattern writing with high efficiency by supporting plural isolated patterns in a window-like opening cut through a plate shaped mask, using microbridges with small widths which cannot be resolved by an electron beam, and by using one of two types of aperture sections of a cell projecting block depending upon the type of resist film used in the electron beam system.

Figure 5:
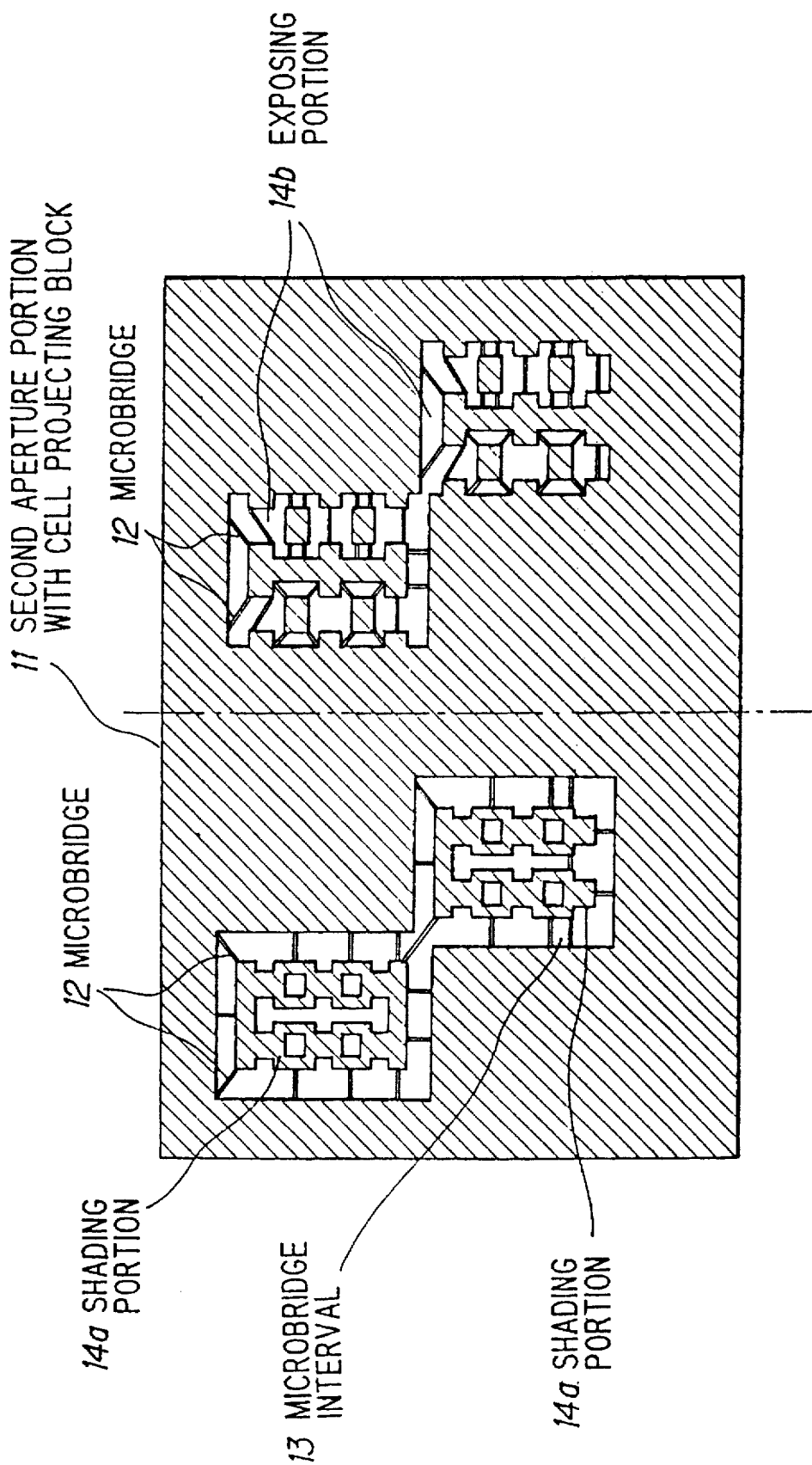
FIG. 5 shows an aperture portion with a cell projecting block according to one preferred embodiment of the invention, which aperture portions with cell projecting being used in an electron beam block is shown system.

Next, the invention will be explained with reference to the appended drawings. FIGS. 5 to 9 are drawings for explaining the preferred embodiments of the invention. FIG. 5 is a drawing of an aperture portion 11 with a cell projecting block used in an electron beam system. When a positive resist film is used, portions on a semiconductor surface corresponding to hatched portions of the aperture portion 11 are not etched, but other portions are etched using an etching process. It should be noted that isolated shading portions 14a and neighboring areas (exposing areas) in part (a) are changed into exposing portions 14b and a neighboring areas (shading areas) in a part (b) of FIG. 5 respectively, if shading and exposing portions are interchanged with each other.

The aperture portion 11 with a cell projecting block in the electron beam system takes the shape of a plate, and several window-like openings are cut through the plate. Isolated patterns are supported by microbridges 12 in respective openings. The widths of the microbridges 12 are so small that the shadows of the microbridges 12 cannot be resolved as patterns projected on the resist film. An interval 13 between adjacent microbridges 12 is larger than the width of the microbridges 12, and thus the shadows of the microbridges 12 do not appear as projected patterns. So long as the aforementioned conditions are satisfied, any number of microbridges can be located in desired portions. In the case wherein the sizes of the patterns on the aperture and resist film are in the ratio 25/1, it is adequate that the width of the microbridges 12 is about 2.0 µm, and the intervals between adjacent microbridges 12 is larger than 2.0 µm. Consequently, when patterns on the aperture portion are written on the resist film on the semiconductor substrate, microbridges are not written on the resist film on the semiconductor substrate, because the width of the microbridges 12 is less than the resolution limit of the electron beam.

Figure 6:
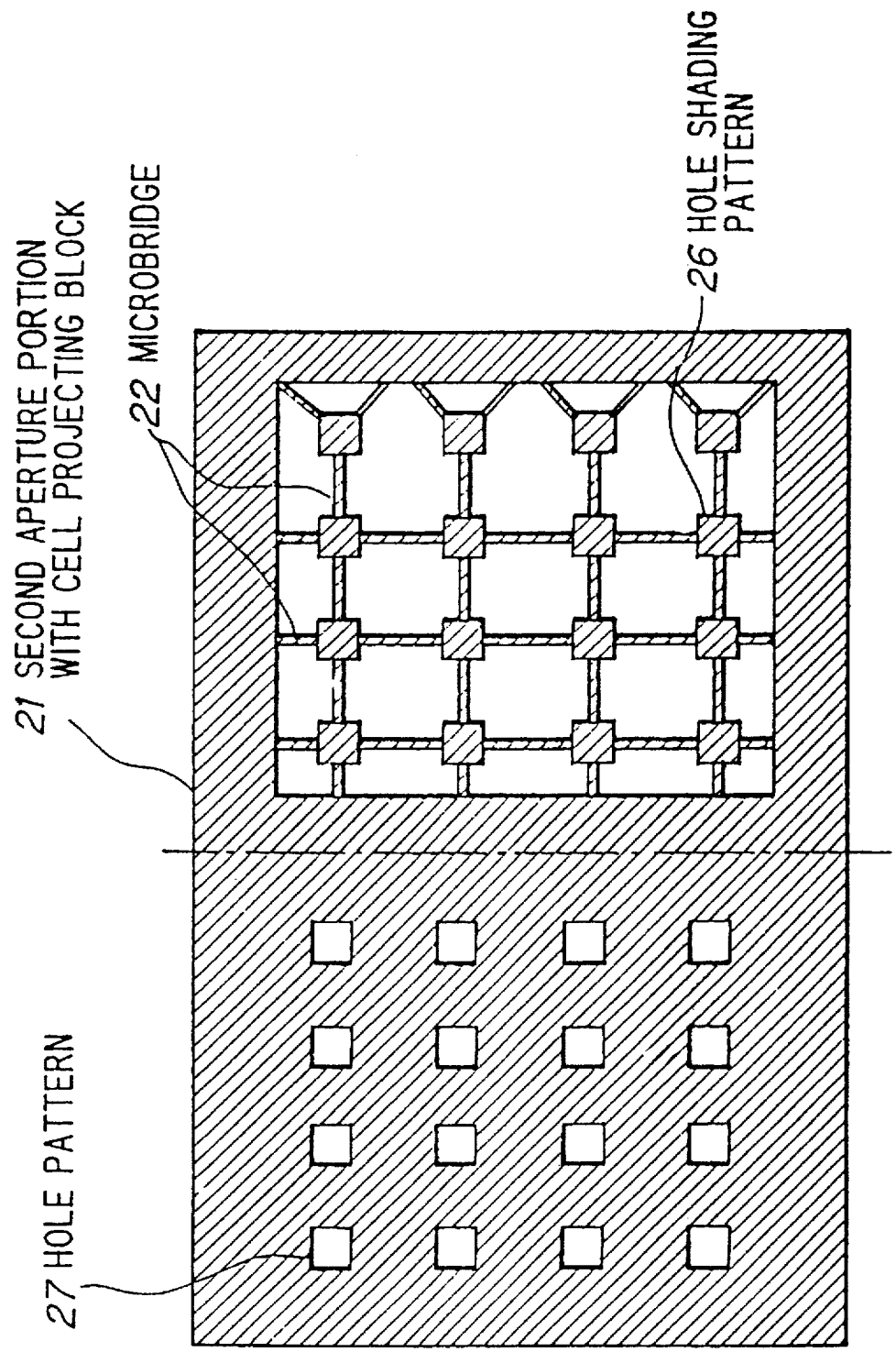
FIG. 6 shows an aperture portion with a cell projecting block according to another preferred embodiment of the invention, which aperture portion with cell projecting block is shown being used in an electron beam system, as another preferred embodiment.

FIG. 6 shows an aperture portion 21 with a cell projecting block for use in the electron beam system. This aperture portion is used in a process for making only contact holes. When patterns are written on a positive resist film, part (a) of FIG. 6 of the aperture portion 21 is used. On the other hand, when the patterns are written on a negative resist film, part (b) of the aperture portion 21 is used. Conventionally, it is very difficult to make the construction shown in part (b) of FIG. 6, since heretofore no means for supporting isolated patterns. Where provided however, according to the invention, it becomes very easy to make an aperture portion including plural isolated patterns and to use a negative resist film.

Figure 7:
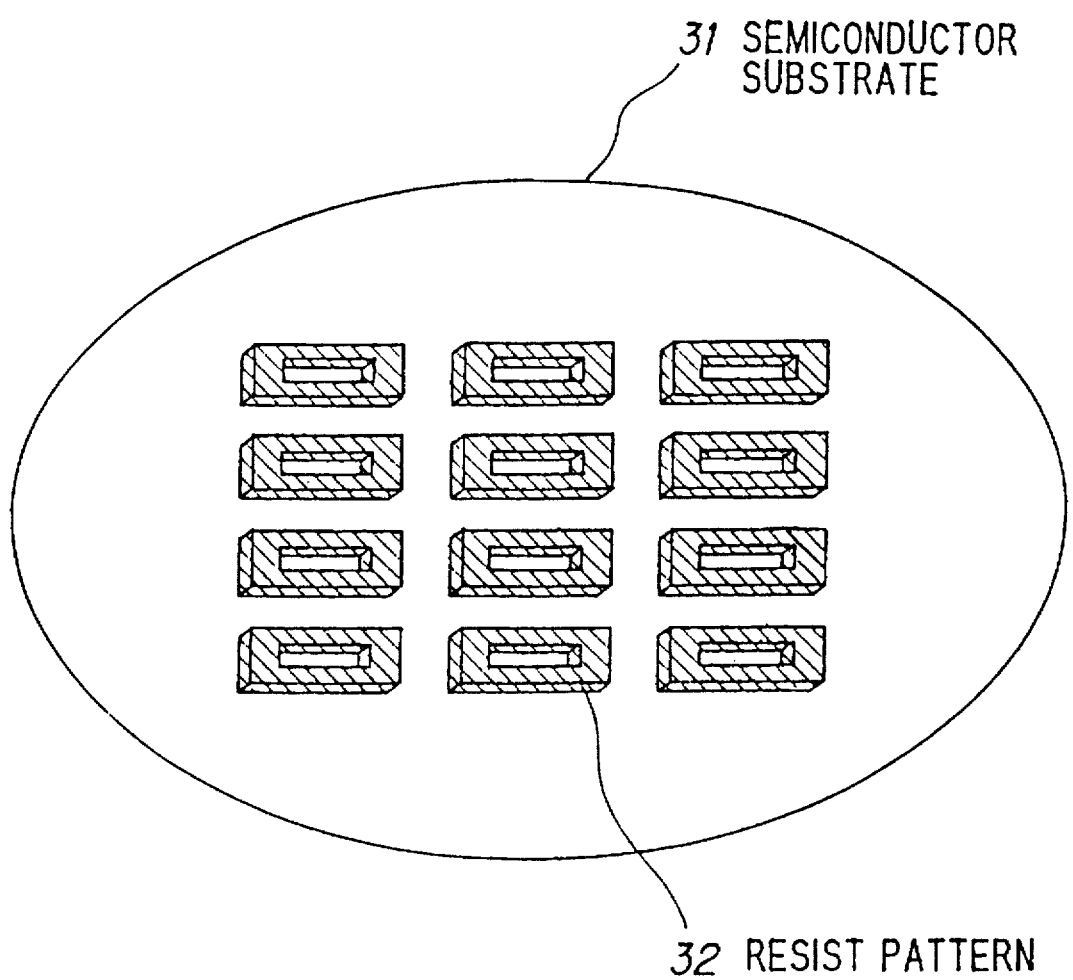
FIG. 7 shows an enlarged view of a portion of resist patterns on a semiconductor substrate produced by using an aperture according to the invention.
Figure 8:
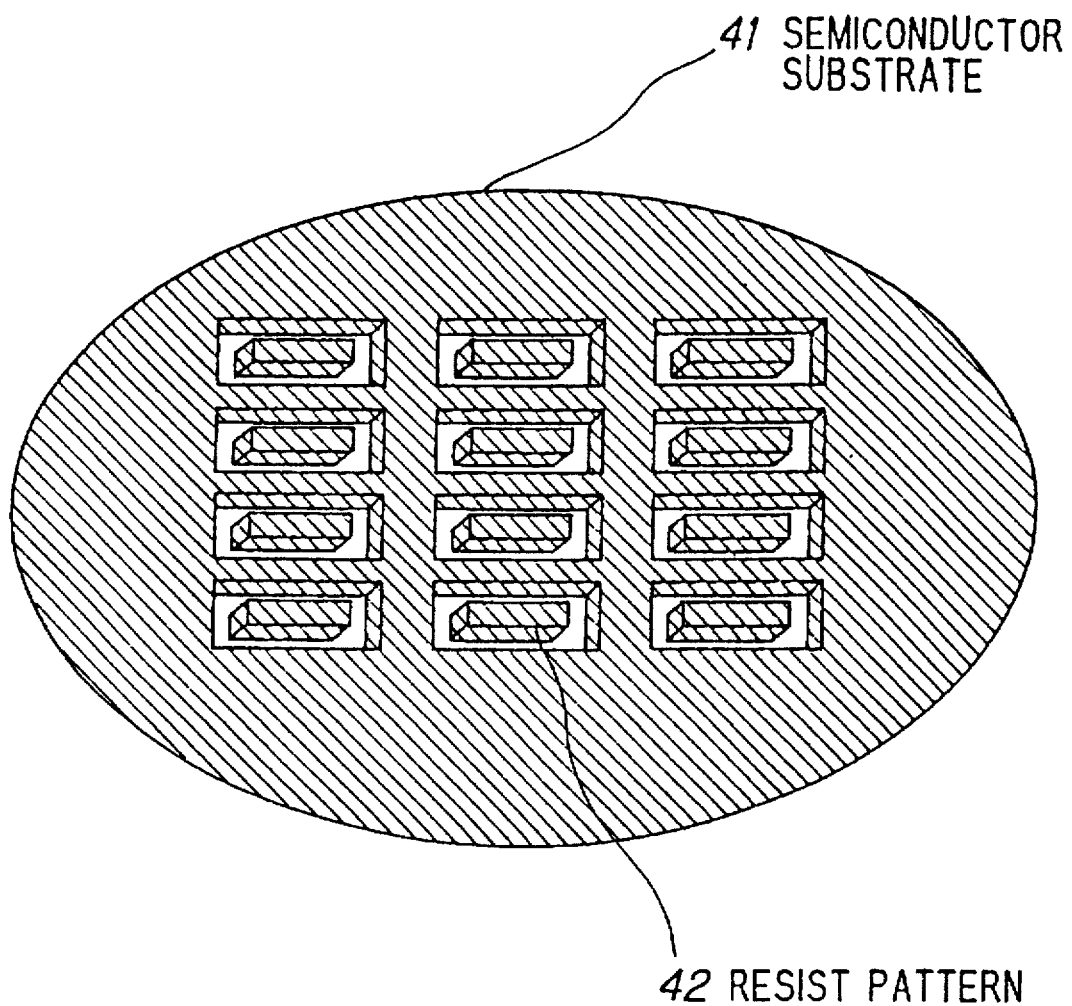
FIG. 8 shows an enlarged view of a portion of other resist patterns on a semiconductor substrate produced by using an aperture according to the invention.
Figure 9:
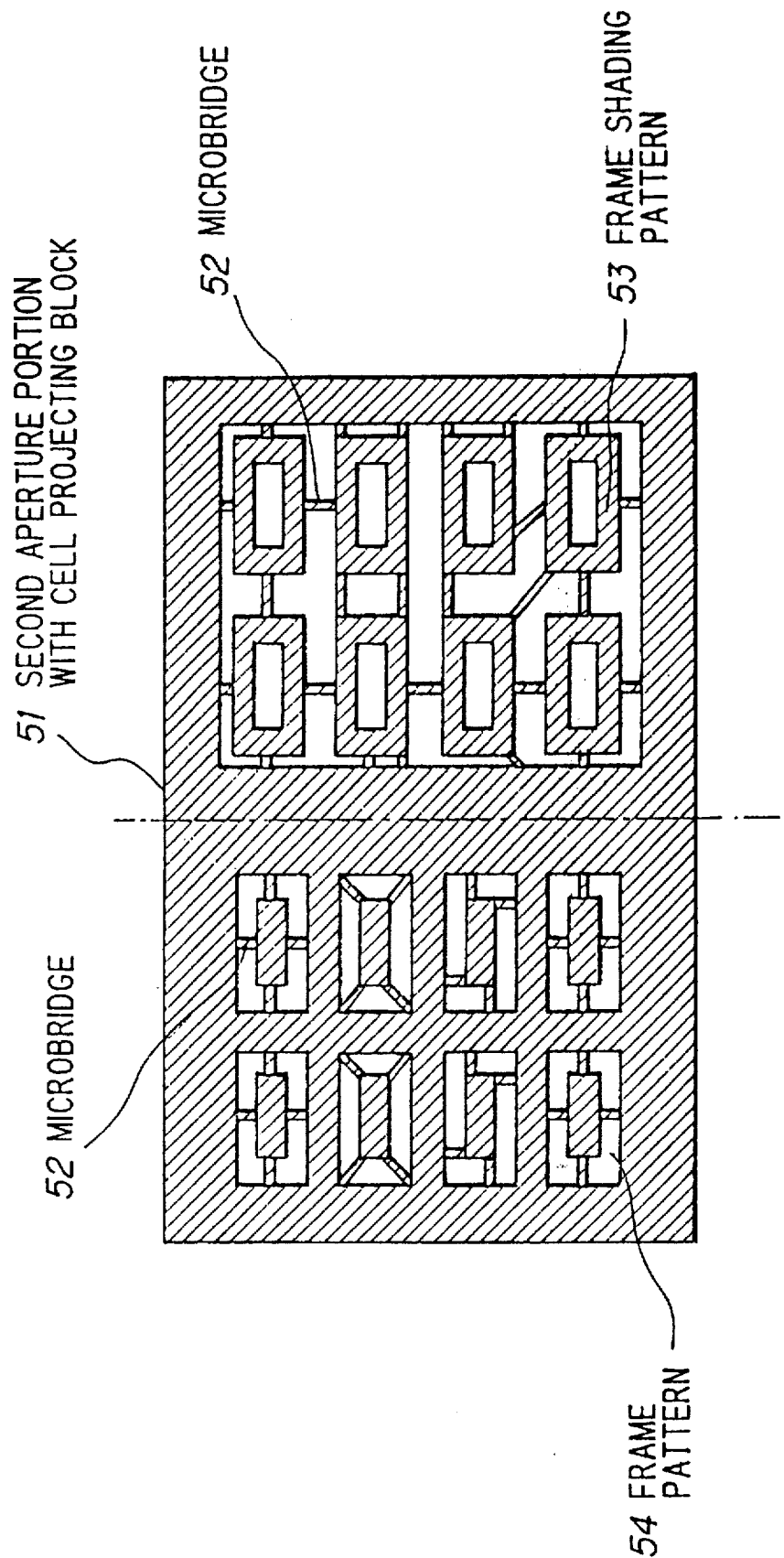
FIG. 9 shows an aperture portion with a cell projecting block according to yet another preferred embodiment of the invention, which aperture portion with all projecting block is shown being used in an electron beam system.

Next, another aperture portion according to the invention will be explained referring to FIGS. 7 to 9. In the case wherein a positive resist film is used and rectangular shaped resist patterns 42, being surrounded by frame-shaped etched portions are formed and arranged in a matrix-like array on a semiconductor substrate 41 as shown in FIG. 8, part (a) of aperture portion 51 shown in FIG. 9 containing repetitive patterns is used. On the other hand, in the case wherein rectangular-frame-shaped resist patterns 32, surrounding etched inner portions are formed and arranged in a matrix-like array on a semiconductor substrate 31 as shown in FIG. 7, patterns shown in part (a) of FIG. 9 are written on a negative film, or patterns shown in part (b) of FIG. 9 are written on a positive resist film. As described in the above, any desired patterns can be written on the resist film with high efficiency by suitably selecting the type of the resist film.

It should be noted that, if all microbridges are ignored in aperture portion 51 shown in FIG. 9, part of a cell projecting block shown in part (b) of FIG. 9 can be formed by replacing shading and exposing areas in part (a) of FIG. 9 with exposing and shading areas respectively. For purposes of this discussion, these parts of the cell projecting block shall be defined as being complimentary to each other. Similar situations exist also in FIGS. 5 and 6.

As described in the above, by using microbridges whose widths are small enough not to be resolved by the electron beam, isolated patterns, such as frame shading patterns, can be written with high efficiency. Moreover, further improvements of efficiency in pattern writing can be obtained by preparing various kinds of isolated patterns. In the conventional method, used to make only contact holes, an electron beam having a rectangular cross-section with variable dimensions and positive resist film are used in most cases. Using this technique, the number of pattern writings required is equal to the number of contact holes, and thus a long time is required to perform the pattern writing. According to the invention, however, patterns of plural contact holes can be written at one time, and the time required for pattern writing is remarkably decreased.

When patterns for contact holes are written on a negative resist film, the area exposed to the electron beam is the whole area of the resist film, except the contact hole portions. In this situation, a long time is required to perform pattern writing using the conventional technique. However, according to the invention, the part of the aperture portion with the cell projecting block suitable for use with the negative-tone resist film can be selected, and pattern writing can be completed in a short time. In the embodiment of the invention, plural isolated patterns can be easily formed in an opening by means of microbridges, and thereby the part of the aperture portion with the cell projecting block suitable for use with the type of resist film can be obtained, and pattern writing can be accomplished with high efficiency.

The functions and effects of the invention can be summarized as follows.

According to the invention of claim 1 mentioned later, the aperture portion is provided with several isolated patterns, which are supported by microbridges with small widths, and therefore the above mentioned isolated patterns, such as isolated frame shading patterns, can be simultaneously written on the resist film. Moreover, by providing the aperture portion with the cell projecting block with isolated patterns having various shapes, various kinds of patterns can be simultaneously written on the resist film. Thus, the through-put of the lithography process can be remarkably improved. Moreover, the width of the microbridges is smaller than the resolution limit of the electron beam. Thus, images of the microbridges do not appear in the projected pattern on the resist film.

According the invention in claim 2 mentioned later, the interval between adjacent microbridges is larger than resolution limit of the electron beam. Thus, shadows of microbridges do not appear in the projected pattern on the resist film.

According to the invention in claims 3 to 4 mentioned later, one part of ordinary and complimentary parts of the cell projecting block can be selectively used with the type of resist film used on the semiconductor substrate. For example, the ordinary part is selected, when a positive type of resist film is used, and the complimentary part is selected, when a negative type resist film is used. Thus, a pattern writing is achieved with high efficiency by appropriately selecting the part of the aperture portion, and the through-put of the lithography process is also remarkably improved.

As described in the above, according to the invention, plural isolated patterns can be supported formed in the opening of the aperture of the electron beam system, by using microbridges whose width is small enough not to be resolved by the electron beam, thereby isolated patterns, such as frame shading ones, can be written with high efficiency. Since the aperture portion has two parts of the cell projecting block which are suitably applied to positive and negative resist films respectively, the through-put of a lithography process can be remarkably improved.

Although the invention has been described with respect to specific embodiments for complete and clear disclosure, the appended claims are not to be thus limited but are to be construed as embodying ell modifications and alternative constructions that may occur to one skilled in the art which fairly fall within the basic teachings herein set forth.

What is claimed is:

1. An aperture with a cell projecting block for use in an electron beam system with pattern writing capability comprising:

at least one window-like opening cut through a plate-shaped mask; and a plurality of isolated patterns supported by microbridges with widths smaller than a limitation of resolution of the electron beam.

2. An aperture with a cell projecting block for use in an electron beam system with pattern writing capability according to claim 1, wherein:

intervals of adjacent microbridges are larger than said limitation of resolution of said electron beam.

3. An aperture-with a cell projecting block for use in an electron beam system with pattern writing capability according to claim 1, wherein:

said cell projecting block includes a pair of two cell projecting block parts which have complementary configurations with respect to each other.

4. An aperture with a cell projecting block for use in an electron beam system with pattern writing capability according to claim 2, wherein:

said cell projecting block includes a pair of two cell projecting block parts which have complementary configurations with respect to each other.

5. An aperture for writing a pattern on a semiconductor device, comprising:

a positive electron beam exposing mask having isolated patterns suspended by microbridges; and a negative electron beam exposing mask having isolated patterns suspended by microbridges;

wherein each of said microbridges of said positive and negative masks has a width smaller than a resolution limitation of an electron beam.

6. The aperture as defined in claim 5, wherein:

an interval of two adjacent microbridges is greater than said resolution limitation.

* * * * *

UNITED STATES PATENT AND TRADEMARK OFFICE
CERTIFICATE OF CORRECTION

PATENT NO. : 5,557,110
DATED : September 17, 1996
INVENTOR(S) : Katsuyuki ITOH

It is certified that error appears in the above-indentified patent and that said Letters Patent is hereby corrected as shown below:

Title Page, please insert after Item [22]

--Foreign Application Priority Data

Jan. 19, 1994 [JP] Japan.................6-018995--.

Signed and Sealed this

Fourth Day of February, 1997

Attest:

BRUCE LEHMAN

*Attesting Officer*  *Commissioner of Patents and Trademarks*